United States Patent [19]

Tai

[11] Patent Number: 4,670,770

[45] Date of Patent: Jun. 2, 1987

[54] INTEGRATED CIRCUIT CHIP-AND-SUBSTRATE ASSEMBLY

[75] Inventor: King L. Tai, Berkeley Heights, N.J.

[73] Assignees: American Telephone and Telegraph Company; AT&T Bell Laboratories, both of Murray Hill, N.J.

[21] Appl. No.: 582,079

[22] Filed: Feb. 17, 1984

[51] Int. Cl.⁴ .......................................... H01L 29/04
[52] U.S. Cl. ...................................... 357/60; 357/55; 357/56; 357/68; 357/74; 357/75; 361/403; 156/659.1
[58] Field of Search ...................... 357/80, 60, 85, 74, 357/75; 361/403, 400; 364/200; 156/659.1, 55, 56, 68, 79

[56] References Cited

U.S. PATENT DOCUMENTS

| | | | |
|---|---|---|---|
| 3,543,106 | 11/1970 | Kern | 357/56 X |
| 4,040,078 | 8/1977 | Eckton, Jr. et al. | 357/55 X |
| 4,141,765 | 2/1979 | Druminski et al. | 357/60 X |
| 4,336,551 | 5/1982 | Fujita et al. | 357/80 |
| 4,385,350 | 5/1983 | Hansen et al. | 364/200 |
| 4,435,498 | 3/1984 | Baillie | 156/659.1 X |
| 4,467,400 | 8/1986 | Stopper | 361/403 |
| 4,500,905 | 2/1985 | Shibata | 357/40 X |
| 4,535,219 | 8/1985 | Sliwa, Jr. | 361/400 X |

FOREIGN PATENT DOCUMENTS

| | | | |
|---|---|---|---|
| 2710952 | 10/1977 | Fed. Rep. of Germany | 357/60 |
| 2810054 | 9/1978 | Fed. Rep. of Germany | 357/80 |
| 0016587 | 2/1978 | Japan | 357/60 |

OTHER PUBLICATIONS

Bodendurf et al., "Active Silicon Chip Carrier," *IBM Technical Disclosure Bulletin*, vol. 15, No. 2, Jul. 1972, pp. 656-657.
"Advanced Printed Circuit Board Design for High-Performance Computer Applications", *IBM Journal of Research and Development*, vol. 26, R. F. Bonner et al., May 1982, pp. 297-305.
"The Thin-Film Module as a High-Performance Semiconductor Package", *IBM Journal of Research and Development*, vol. 26, C. W. Ho et al., May 1982, pp. 286-296.
"Wafer-Chip Assembly for Large-Scale Integration", *IEEE Transaction on Electron Devices*, vol. ED-15, P. Kraynak et al., pp. 660-663, Sep. 1968.
Leone et al., "Fabricating Shaped Grid and Aperture Holes," *IBM Technical Disclosure Bulletin*, vol. 14, No. 2, Jul. 1971, pp. 417-418.
Bonner et al., "Advanced Printer Circuit Board Design For High-Performance Computer Applications," *IBM Jour. of Research and Develop.*, vol. 26, May 82, 297-305.
Kraynak et al., "Wafer-Chip Assembly For Large-Scale Integration," *IEEE Transaction on Electron Devices*, vol. ED-15, Sep. 1968, pp. 660-663.

*Primary Examiner*—Andrew J. James
*Assistant Examiner*—William A. Mintel
*Attorney, Agent, or Firm*—Peter A. Businger

[57] ABSTRACT

In the interest of enhanced yield in the manufacture of "wafer-scale" integrated circuits an assembly of integrated circuit chips is made by placing chips on a substrate. Chips have beveled edges as produced by crystallographically anisotropic chemical etching, and the substrate has wells, grooves, or openings having sloping walls. Chips are positioned on the substrate by bringing sloping walls and beveled edges in juxtaposition, and circuitry on chips is connected to circuitry on the substrate.

18 Claims, 4 Drawing Figures

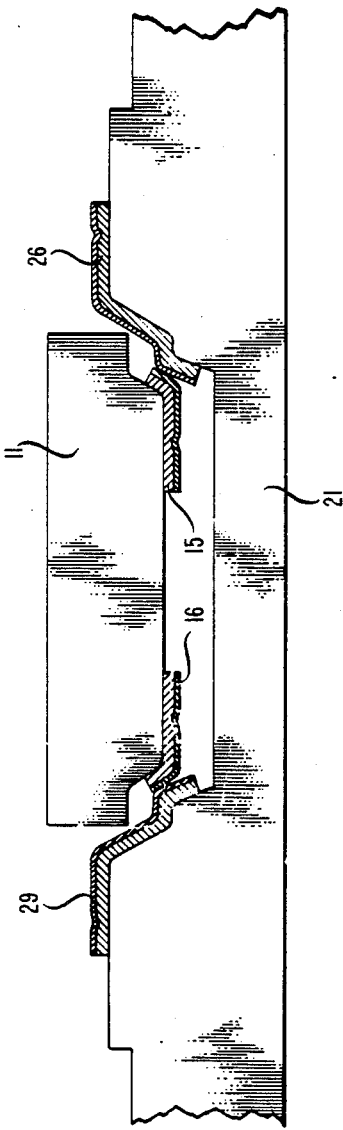

INTEGRATED CIRCUIT CHIP-AND-SUBSTRATE ASSEMBLY

CROSS-REFERENCE TO RELATED APPLICATIONS

Concurrently filed are patent applications Ser. No. 581,258 by D. E. Blahut, Ser. No. 581,259 by K. K. Ng et al., Ser. No. 581,260 by K. K. Ng et al., and Ser. No. 581,336 by K. K. Ng et al.

TECHNICAL FIELD

The invention is concerned with integrated circuit technology.

BACKGROUND OF THE INVENTION

To satisfy an ever-increasing demand for computing and data processing power both with respect to processing speed and storage capacity, computer design has been evolving toward increasingly compact arrangements of components and assemblies. Attention has been directed to the number of so-called package levels (a package being defined as a group of structurally similar components or assemblies) as, e.g., by R. F. Bonner et al., "Advanced Printed-Circuit Board Design for High-Performance Computer Applications," *IBM Journal of Research and Development*, Vol. 26, No. 3, May 1982, pp. 297–305.

Attention has also been given to the way components and assemblies are interconnected; e.g., C. W. Ho et al., "The Thin-Film Module as a High-Performance Semiconductor Package," *IBM Journal of Research and Development*, Vol. 26, No. 3, May 1982, pp. 287–296, discuss a multi-chip module of silicon chips attached to thin-film transmission lines. Among early proposals for the achievement of high device density in silicon technology is one by P. Kraynak et al., "Wafer-Chip Assembly for Large-Scale Integration," *IEEE Transactions on Electron Devices*, Vol. ED-15, No. 9, September 1968, pp. 660–663, where silicon chips are bonded "face down" on a silicon wafer.

SUMMARY OF THE INVENTION

Integrated circuit chips are assembled on a carrier substrate and are electrically interconnected. The positioning of at least one chip on the carrier substrate involves bringing at least one beveled sidewall in juxtaposition with a sloping wall of a surface depression such as, e.g., a wall, groove or opening in the carrier substrate. Substrate and chip materials are crystallographically compatible, essentially single-crystal materials, and they are preferably essentially the same. Sloping walls are made by crystallographically anisotropic etching which acts at differing rates in different crystallographic directions; angles other than 90 degrees are thus produced between etched surfaces and surfaces which are not exposed to an etchant. Typically, alignment of chips involves match-up between two or four pairs of sloping faces, e.g., when chips are aligned in grooves or in four-sided wells.

BRIEF DESCRIPTION OF THE DRAWING

FIG. 4 shows schematically and partially in cross section, an integrated circuit chip having beveled edges which are juxtaposed sloping walls of a well in a substrate, representing a preferred embodiment of the invention.

DETAILED DESCRIPTION

The following terms are prominently used in the description of the invention, and their meaning is as follows:

A substrate is a material body which has a surface which can serve as a support for material objects which may be insufficiently rigid in the absence of support or whose spatial arrangement depends on the presence of a support. A substrate typically is relatively thin as compared with a planar extent.

A carrier substrate and a chip are mutually defined as substrates of relatively larger and smaller size, respectively, so that a plurality of chips can be attached to a carrier substrate.

An integrated circuit is a miniaturized electrical circuit which is supported by a substrate.

Preferential etching or crystallographically anisotropic etching is a chemical process which results in removal of surface matter at rates which differ depending on crystallographic direction in an essentially single-crystal material.

In accordance with the invention and in the interest of positioning a chip on a carrier substrate so as to facilitate electrical interconnection of circuitry on the chip and on the substrate, preferential etching is applicable to at least a portion of substrate material and at least a portion of chip material. Such portions are here designated as body portions, and it is understood that substrate and chip may comprise portions other than such body portions such as, e.g., devices, circuits, and passive components.

Figure 1:
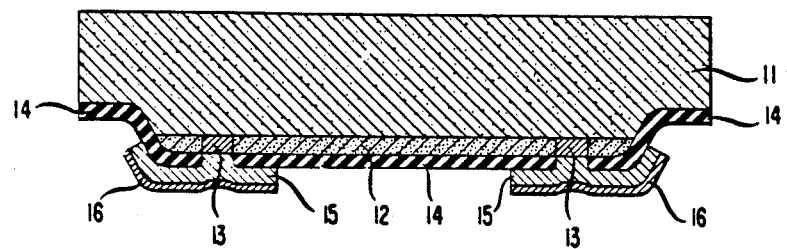
FIG. 1 is a schematic, cross-sectional view of a portion of a circuit chip for use in accordance with the invention.

FIG. 1 shows chip 11, integrated circuit 12 with contact pads 13, insulating layer 14, metallic contact 15 which is preferably solder-wettable as, e.g., when consisting essentially of a Ti-Pd-Au or Cr-Cu-Au alloy, and solder metal 16. Beveled portions of chip 11 preferably have a depth which is at least 2 mils.

Figure 2:
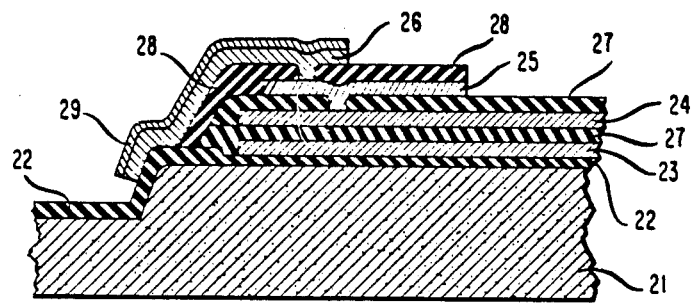
FIG. 2 is a schematic, cross-sectional view of a portion of a wafer for use in accordance with the invention.

FIG. 2 shows carrier substrate 21 which serves as electrical ground electrode and which is heavily doped at the surface, insulating oxide layer 22, power supply metallic conductor 23, x-signal metallic conductor 24, y-signal metallic conductor 25, metallic contact stripe 26, polymeric insulating layers 27, cap layer 28 made, e.g., of silicon nitride, and solder metal layer 29. The material of conductors 23, 24, and 25 is typically aluminum, and the material of metallic contact 26 is preferably solder wettable as, e.g., when consisting essentially of a Ti-Pd-Au or Cr-Cu-Au alloy. Metallization 23, oxide layer 22, and substrate 21 form a metal-oxide-semiconductor decoupling capacitor. Electrical contact stripe 26 is shown connected to x-conductor 24; other contact stripes (not shown) may be connected to power supply 23 or y-conductor 27.

Figure 3:
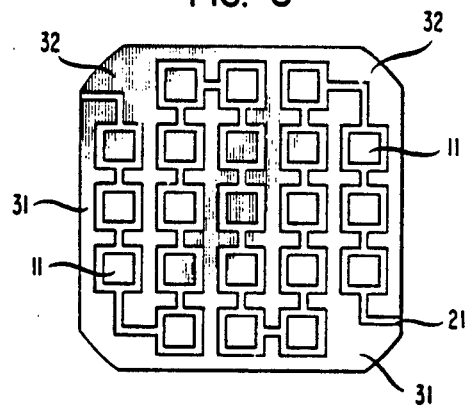
FIG. 3 is a reduced-scale, schematic plan view of an integrated circuit assembly in accordance with the invention, illustrating a ground metallization layer and a power metallization layer deposited side by side.

FIG. 3 shows wafer 21 serving as carrier substrate for chips 11, ground metallization layer 31, and power metallization layer 32. There is easy access to each chip from ground and power metallizations; more elaborate metallization patterns may be used as needed; e.g., narrow stripes of ground and power metallizations may extend at least partly around a chip to facilitate access to ground or power from any side of a chip.

Ground metallization layer 31 is electrically connected to heavily doped silicon substrate 21, and power layer 32 is deposited on a thin insulating layer, e.g., as shown in FIG. 2.

The material of chip 11 and of carrier substrate 21 in FIGS. 2 and 3 is preferably the same, essentially single-crystal material which is amenable to preferential etching. Silicon is a primary example of such a material, potassium hydroxide being a convenient etchant in this case. (Etching of silicon for mask alignment is disclosed in U.S. patent application Ser. No. 550,190, filed Nov. 9, 1983 by T. L. Poteat.) Among other suitable materials are III-V semiconductor compounds such as, e.g., gallium arsenide and gallium arsenide indium phosphide.

In a preferred embodiment, unpackaged silicon chips are mounted onto a silicon wafer which serves as carrier substrate. Inter-chip connections are provided by two levels of signal nets with 5-15 μm wide conductive paths, a power plane and a ground plane. To insulate the planes, a photodefinable polymer (such as, e.g., a photosensitive polyimide) having a low dielectric constant is used.

Methods to interconnect the chips and the wafer include techniques such as, e.g., wire bonding, tape-automatic bonding or "flip-chip" solder balls on solder pads. Moreover, as illustrated by FIGS. 1 and 2, self-aligned micro-stripes of solder metal on the chip can be used to connect to similar stripes on the wafer.

In accordance with a preferred embodiment of the invention, in the case of silicon wafers and chips, it is possible to fabricate chips with precisely oriented beveled sides ((111) faces) by anisotropic wet etching of wafers having (100) surface planes, with the resulting beveled faces at an angle of 54 degrees. These can be inserted into matching beveled walls in silicon wafers, with an angle of 126 degrees between the bevel and the wafer plane.

Micro-solder stripes over the beveled oxides of the chips and wells can be defined in a CVD deposited, evaporated or sputtered resist, such as, e.g., $Ag_{2.0}Se/Ge_{0.15}Se_{0.85}$ which allows nonplanar lithography as disclosed in a patent application Ser. No. 665,970 by E. T. T. Ong et al filed Oct. 29, 1984. After the beveled chips have been dropped into the corresponding wells in the wafer, the micro-solder stripes on the chips and on the walls of the wells can be fused by reflowing the solder.

Passive components such as resistors, capacitors and crystal oscillators can be incorporated into the silicon wafer by mounting on similarly beveled silicon plugs which are fitted into wells in the wafer. Furthermore, optical fibers may terminate on a chip which may carry, e.g., an optical detector or a laser.

Beveled silicon planes can also be used for interconnection changes or customizations. Some wells may traverse the entire wafer thickness to allow interconnection, changes, or repairs on a circuit.

When 4" or 5" silicon wafers are used, one wafer can replace a printed wiring board to form a subsystem or a system. This is advantageous because the high chip packing density allows short average interconnection lengths, short delay times, and lower capacitance and power consumption. Simultaneous switching noise induced by the inductance of the bonding wires is eliminated.

The self-aligned micro-solder stripes techniques can provide an input/output of 400-800 I/O channels per chip without penalty in chip packing density. The all-silicon system proposed alleviates the present reliability problems due to thermal mismatch between silicon, ceramics and printed circuit board materials, and the high thermal conductivity of silicon minimizes the danger of overheating of the components.

An example of an application is a "memory pack" consisting of a set of wafers stacked together, each wafer having an array of high density memory chips. Such a pack offers the speed of a random access memory and the mass storage capacity of a disc.

The entire system can be designed by existing computer aided design processes and computer aided testing can be implemented. The drastic increase in I/O capability and chip packing density should provide new opportunities in system architecture. Since the penalty of "going off" the chip is removed, there is a lesser need to increase the number of circuits per chip. Thus, yield would be increased as the chip sizes are reduced. Furthermore, faster circuits with submicron design rules become manufacturable as the chip size shrinks.

Device assemblies as disclosed above are considered to be particularly suitable for the implementation of systems as disclosed in the above-identified patent application, Ser. No. 581,258 which is incorporated herein by reference and, which is directed to a plurality of component circuits being coupled together via a signal conduit path. Each of the component circuits is adapted to have a priority with respect to the transmission of information onto the signal conduit path. A plurality of arbitration conduit paths exists. Each of the component circuits, except for possibly the component circuit having the lowest priority, comprises a separate one of a plurality of arbitration request circuits. Each arbitration request circuit is coupled to a separate one of the arbitration conduit paths and is adapted to selectively allow a signal from its component circuit to reach the arbitration conduit path coupled thereto. Each of the component circuits, except for possibly the component circuit having a highest priority, comprises a separate one of a plurality of arbitration circuits. Each arbitration circuit is coupled to at least one of the arbitration conduit paths and is adapted to detect which of any of the other component circuits having a higher priority is requesting access to the signal conduit path and to enable its component circuit to gain access to the signal conduit path if its component circuit is requesting access to the signal conduit path and if its component circuit has a higher priority than any other component circuit which is requesting such access.

What is claimed is:

1. Device comprising a substrate and an integrated circuit chip,
    said circuit chip comprising means for connecting integrated circuitry on said chip with circuitry on said substrate,
    said substrate having a surface depression which has a sloping wall resulting from crystallographically anisotropic etching,
    said chip having a beveled edge matching said sloping wall and resulting from crystallographically anisotropic etching, and said edge and said slope being in juxtaposition, whereby said chip is positioned on said substrate.

2. Device of claim 1, the material of at least a body portion of said substrate and the material of at least a body portion of said chip having the same crystallographic structure.

3. Device of claim 2, the material of said body portion of said substrate being essentially the same as the material of said body portion of said chip.

4. Device of claim 3 in which said material is a semiconductor material.

5. Device of claim 1 in which at least two beveled edges of a chip are in juxtaposition with sloping walls of a surface depression.

6. Device of claim 5 in which four beveled edges of a chip are in juxtaposition with sloping walls of a surface depression.

7. Device of claim 4 in which said material is essentially silicon.

8. Device of claim 1 in which said chip has a circuit-carrying side which faces into a well in said wafer.

9. Device of claim 8 in which contact is made to said circuit by at least one stripe conductor on a sidewall.

10. Device of claim 1 comprising a plurality of chips, said chips being electrically interconnected by electrical conductors on said wafer.

11. Device of claim 10 in which said electrical conductors comprise a ground conductor and a power conductor and in which an integrated decoupling capacitor is between said ground conductor and said power conductor.

12. Device of claim 11 in which said decoupling capacitor is a metal-oxide-semiconductor capacitor.

13. Device of claim 11 in which said electrical conductors are separated by a photodefinable polymer material.

14. Device of claim 1 comprising at least one passive component which is mounted on said chip.

15. Device of claim 1 in which at least one optical fiber terminates on said chip.

16. Device comprising a substrate and a plurality of silicon integrated circuit chips physically attached to said substrate,
said circuit chips comprising means for connecting integrated circuitry on said chip with circuitry on said substrate,
said silicon circuit chips being electrically connected to lithographically defined circuitry on said substrate,
said substrate consisting essentially of single-crystal silicon, and
said electrical circuitry comprising a ground conductor and a power conductor and an integrated decoupling capacitor between said ground conductor and said power conductor.

17. Device of claim 16 in which said decoupling capacitor is a metal-oxide-semiconductor capacitor.

18. Device of claim 17 in which said capacitor consists of said substrate, an oxide layer on said substrate, and a metallic layer on said oxide layer.

* * * * *